(12) United States Patent
Xu

(10) Patent No.: US 11,798,953 B2
(45) Date of Patent: Oct. 24, 2023

(54) ARRAY SUBSTRATE AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Zhida Xu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 535 days.

(21) Appl. No.: 16/973,014

(22) PCT Filed: Nov. 24, 2020

(86) PCT No.: PCT/CN2020/131123
§ 371 (c)(1),
(2) Date: Dec. 7, 2020

(87) PCT Pub. No.: WO2022/036910
PCT Pub. Date: Feb. 24, 2022

(65) Prior Publication Data
US 2022/0199649 A1    Jun. 23, 2022

(30) Foreign Application Priority Data
Aug. 19, 2020 (CN) .......................... 202021732982.0

(51) Int. Cl.
*H01L 27/12* (2006.01)
*G02F 1/1362* (2006.01)
*H01L 25/18* (2023.01)

(52) U.S. Cl.
CPC ...... *H01L 27/124* (2013.01); *G02F 1/136286* (2013.01); *H01L 25/18* (2013.01)

(58) Field of Classification Search
CPC . H01L 27/124; H01L 25/18; G02F 1/136286; G02F 1/1345; G02F 1/133357; G02F 2201/48; G02F 1/1337
See application file for complete search history.

(56) References Cited

U.S. PATENT DOCUMENTS

2020/0272008 A1* 8/2020 Chen ................... G02F 1/1337
2020/0348552 A1* 11/2020 Ouyang ............... G02F 1/1343

FOREIGN PATENT DOCUMENTS

CN          107329313 A          11/2017
CN          110045554 A          7/2019
(Continued)

Primary Examiner — Syed I Gheyas
(74) Attorney, Agent, or Firm — The Roy Gross Law Firm, LLC; Roy Gross

(57) ABSTRACT

The present application provides an array substrate and a display panel. The array substrate includes fan-out regions and an inverted region formed between two adjacent fan-out regions. The array substrate includes metal lines and floating metal lines. The metal lines include first metal lines in the fan-out region and second metal lines in the inverted triangle region. The floating metal lines include a first floating metal line arranged between the first metal lines and the second metal lines. The array substrate includes an alignment film arranged on the metal lines and the floating metal lines.

20 Claims, 4 Drawing Sheets

(56) References Cited

FOREIGN PATENT DOCUMENTS

| | | |
|---|---|---|
| CN | 110061012 A | 7/2019 |
| CN | 209496223 U | 10/2019 |
| CN | 211554586 U | 9/2020 |
| JP | 2007121792 A | 5/2007 |

* cited by examiner

ARRAY SUBSTRATE AND DISPLAY PANEL

CROSS REFERENCE TO RELATED APPLICATIONS

This application is a National Phase of PCT Patent Application No. PCT/CN2020/131123 having International filing date of Nov. 24, 2020, which claims the benefit of priority of Chinese Application No. 202021732982.0 filed on Aug. 19, 2020. The contents of the above applications are all incorporated by reference as if fully set forth herein in their entirety.

FIELD OF DISCLOSURE

The present application relates to a field of display technology and in particular, to an array substrate and a display panel.

DESCRIPTION OF RELATED ART

With the development of flat panel display technology, there has been a trend to develop flat panel displays with high resolution, high contrast ratios, high refresh rate, narrow bezel, and thinness. At present, liquid crystal displays are still the mainstream products of flat panel displays. Especially now that all large-size flat panel displays have been developed to approach 8K resolution. To maintain the narrow bezels at extremely high resolutions while providing good display quality, there are a lot of challenges in manufacturing processes, such as coating an alignment film (PI) on one side of an array substrate.

Generally, signal lines in a display region of an array substrate are connected to terminal pads at an edge of the array substrate through metal lines of the fan-out region, and an inverted triangle region is formed between adjacent fan-out regions. In order to realize a narrow-bezel design of liquid crystal display (LCD) panels, some products have other metal lines (e.g. COM lines) in the inverted triangle region. Since the metal lines in the inverted triangle region form a "retaining wall" configuration or the like, a terrain (surface shape) of this area is uneven. At present, there are mainly two ways to form alignment films. One way is to form the alignment film using a transfer printing method with a printing plate, and the other way is to form the alignment film by inkjet printing. When the alignment film is made by inkjet printing, a single drop volume coming out of a solution for making the alignment film is the same (generally 85 ng) in different positions, but the metal lines in the inverted triangle region described above easily form a "retaining wall", making an alignment film material easier to accumulate and become thicker here, resulting in uneven surface of the alignment film and disordered distribution of liquid crystals on the surface of the alignment film, which in turn leads to brighter display areas near the fan-out region/inverted triangle regions and causes uneven brightness (mura).

Therefore, there is an urgent need to solve the above problems in conventional techniques.

SUMMARY

The present application provides an array substrate and a display panel, which can solve uneven brightness problems in a display region caused by uneven surface of an alignment film.

In order to solve the above problems, the present application provides technical solutions as follows.

The present application provides an array substrate, comprising a display region and a non-display region, wherein the non-display region is provided with at least two fan-out regions connected to a driving chip, and an inverted triangle region is formed between two adjacent fan-out regions at a same side of the display region;

the array substrate comprises a plurality of metal lines and a plurality of floating metal lines, the metal lines comprise a plurality of first metal lines and a plurality of second metal lines, the first metal lines are distributed in a fan shape in the fan-out region, and the second metal lines are arranged corresponding to the inverted triangle region;

the floating metal lines comprise a plurality of first floating metal lines arranged in the inverted triangle region, and the first floating metal line is located between the first metal lines and the second metal lines; and the array substrate further comprises an alignment film disposed on the metal lines and the floating metal lines.

In the array substrate of the present application, an orthographic projection of the metal lines projected on the array substrate and an orthographic projection of the floating metal lines projected on the array substrate are non-overlapping with each other.

In the array substrate of the present application, at least two of the first metal lines are distributed in a divergent manner at one end close to the display region, and are distributed in a concentrated manner at one end far away from the display region, and at least two of the second metal lines are arranged spaced apart from each other in a direction from near to away from the display region.

In the array substrate of the present application, the floating metal lines further comprise a plurality of second floating metal lines disposed in the inverted triangle region, and the second floating metal line is disposed between two adjacent second metal lines.

In the array substrate of the present application, the floating metal lines further comprise a plurality of third floating metal lines disposed in the fan-out region, and the third floating metal line is located between two adjacent first metal lines.

In the array substrate of the present application, the second metal line comprises a first portion and a second portion which are symmetrically arranged with respect to a center line between two adjacent fan-out regions, a wiring direction of the first portion is the same as a wiring direction of the adjacent first metal line on a same side of the center line, and a wiring direction of the second portion is the same as a wiring direction of the adjacent first metal line on a same side of the center line.

In the array substrate of the present application, the first metal lines and the second metal lines are arranged in different layers, the floating metal lines comprise a plurality of first-layer floating metal lines arranged in a same layer as the first metal lines and a plurality of second-layer floating metal lines arranged in a same layer as the second metal lines, and an orthographic projection of the first-layer floating metal lines projected on the array substrate and an orthographic projection of the second-layer floating metal lines projected on the array substrate are non-overlapping with each other.

In the array substrate of the present application, the metal lines and the floating metal lines are located in a same layer, and a distance between the floating metal line and the metal line is greater than 8 microns.

In the array substrate of the present application, the floating metal lines comprise multiple floating metal blocks, and the floating metal blocks are distributed at intervals along wiring directions of the first metal lines and/or wiring directions of the second metal lines.

In the array substrate of the present application, a direction of a gap formed between two adjacent floating metal blocks is perpendicular to the wiring direction of the second metal line and the wiring direction of the first metal line.

The present application further provides a display panel, comprising an array substrate, wherein the array substrate comprising a display region and a non-display region, wherein the non-display region is provided with at least two fan-out regions connected to a driving chip, and an inverted triangle region is formed between two adjacent fan-out regions at a same side of the display region;

the array substrate comprises a plurality of metal lines and a plurality of floating metal lines, the metal lines comprise a plurality of first metal lines and a plurality of second metal lines, the first metal lines are distributed in a fan shape in the fan-out region, and the second metal lines are arranged corresponding to the inverted triangle region;

the floating metal lines comprise a plurality of first floating metal lines arranged in the inverted triangle region, and the first floating metal line is located between the first metal lines and the second metal lines; and the array substrate further comprises an alignment film disposed on the metal lines and the floating metal lines.

In the display panel of the present application, an orthographic projection of the metal lines projected on the array substrate and an orthographic projection of the floating metal lines projected on the array substrate are non-overlapping with each other.

In the display panel of the present application, at least two of the first metal lines are distributed in a divergent manner at one end close to the display region, and are distributed in a concentrated manner at one end far away from the display region, and at least two of the second metal lines arranged spaced apart from each other in a direction from near to away from the display region.

In the display panel of the present application, the floating metal lines further comprise a plurality of second floating metal lines disposed in the inverted triangle region, and the second floating metal line is disposed between two adjacent second metal lines.

In the display panel of the present application, the floating metal lines further comprise a plurality of third floating metal lines disposed in the fan-out region, and the third floating metal line is located between two adjacent first metal lines.

In the display panel of the present application, the second metal line comprises a first portion and a second portion that are symmetrically arranged with respect to a center line between two adjacent fan-out regions, a wiring direction of the first portion is the same as a wiring direction of the adjacent first metal line on a same side of the center line, and a wiring direction of the second portion is the same as a wiring direction of the adjacent first metal line on a same side of the center line.

In the display panel of the present application, the first metal lines are arranged in a layer different from a layer in which the second metal lines are arranged, the floating metal lines comprise a plurality of first-layer floating metal lines arranged in the same layer as the first metal lines and a plurality of second-layer floating metal lines arranged in the same layer as the second metal lines, and an orthographic projection of the first-layer floating metal lines projected on the array substrate and an orthographic projection of the second-layer floating metal lines projected on the array substrate are non-overlapping with each other.

In the display panel of the present application, the metal lines and the floating metal lines are located in a same layer, and a distance between the floating metal line and the metal line is greater than 8 microns.

In the display panel of the present application, the floating metal lines comprise multiple floating metal blocks, and the floating metal blocks are distributed at intervals along wiring directions of the first metal lines and/or wiring directions of the second metal lines.

In the display panel of the present application, a direction of a gap formed between two adjacent floating metal blocks is perpendicular to the wiring direction of the second metal line and the wiring direction of the first metal line.

The present application provides an array substrate and a display panel. The array substrate comprises a fan-out region arranged at one side of a display region, and is formed between two adjacent fan-out regions at a same side of the display region. In an inverted triangle region of the present application, floating metal lines are arranged at a non-wiring portion of the inverted triangle region, that is, the floating metal line is arranged between the first metal line and the second metal lines to improve a terrain (surface unevenness) of the inverted triangle area. Thereby, a "retaining wall" effect caused by the second metal line in the inverted triangle region is weakened, and consequently, an uneven brightness problem in the display region caused by uneven surface of an alignment film is solved.

BRIEF DESCRIPTION OF DRAWINGS

The following detailed description of the present application in conjunction with the accompanying drawings and specific embodiments is provided for ease of understanding of the technical solutions and other advantages of the present application.

DETAILED DESCRIPTION OF EMBODIMENTS

Figure 1:
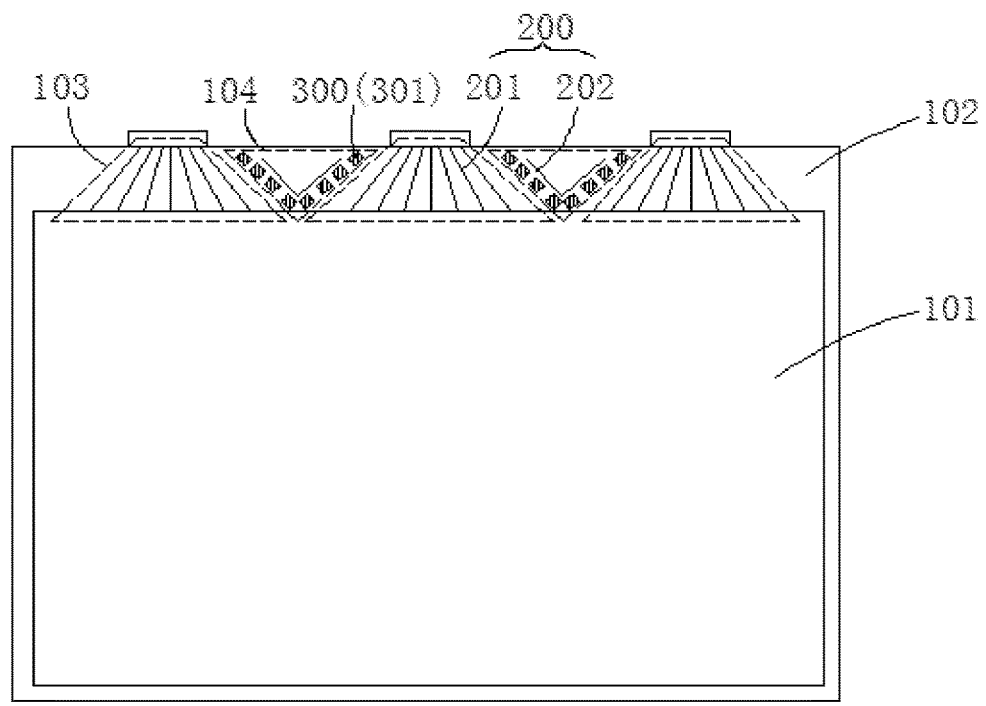
FIG. 1 is a schematic structural view illustrating an array substrate according to one embodiment of the present application.

The technical solutions of the present application will be clearly and completely described below in conjunction with the accompanying drawings and specific embodiments of the present application. Obviously, the described embodiments are only some of the embodiments of the present application, rather than all the embodiments. Based on the embodiments in the present application, all other embodiments obtained by those skilled in the art without creative work fall within the protection scope of the present application.

In the description of the present application, it should be noted that directional terms such as "longitudinal", "lateral", "length", "width", "upper", "lower", "front", "rear", "left", "right", "vertical", "horizontal" are based on the orientation or positional relationship shown in the drawings, and are only for illustrative purposes to simplify the description. The directional terms do not indicate or imply the device or the element referred to must have a specific orientation, be constructed and operated in a specific orientation, and therefore cannot be understood as a limitation of the application. In addition, the terms "first" and "second" are only used for illustrative purposes, and cannot be understood as indicating or implying relative importance or implicitly indicating the number of indicated technical features. Therefore, the feature defined with "first" and "second" may explicitly or implicitly include one or more of the feature. In the description of the present application, "a plurality of" means two or more than two, unless otherwise specifically defined. In the present application, "l" means "or".

The present application may repeat reference numerals and/or reference letters in different examples. Such repetition is for the purpose of simplification and clarity, and does not indicate the relationship between the various embodiments and/or configurations discussed.

In order to realize a narrow bezel design of a display panel, signal lines in a display region of the display panel are usually connected to multiple driving chips through metal lines in a fan-out region. This can greatly reduce a wiring width of the metal lines in the fan-out region in a direction perpendicular to the corresponding bezel, thereby realizing the narrow bezel design.

In order to further realize the narrow bezel design of the display panel, the signal lines of the non-display region of the display panel are usually arranged in an inverted triangle region formed between two adjacent fan-out regions. This way, a space can be utilized to the greatest extent, but in order to avoid signal interference between different signal lines, there will be a certain distance between a signal line in the inverted triangle region and the metal line in the fan-out region. In this distance range, there is no wiring layouts, which makes the signal line in the inverted triangle region easy to form a "retaining wall". As a result, in subsequent film formation processes, it is easy to form a "recess" between the signal line in the inverted triangle region and the metal line in the fan-out region. During a process of forming an alignment film (PI), the alignment film material tends to form accumulations in the "recess". The alignment film here is thicker than the alignment film in other places, which affects surface evenness of the alignment film.

The purpose of the present application is to provide an array substrate and a display panel, which can improve surface unevenness of the inverted triangle region and increase thickness uniformity of the alignment film, thereby solving an uneven brightness problem in the display region caused by uneven surface of the alignment film.

The array substrate of the present application is described in detail below with reference to specific embodiments.

First Embodiment

Referring to FIG. 1, it is a schematic structural view illustrating the array substrate of the present application. The array substrate comprises a display region 101 and a non-display region 102, wherein the non-display region 102 comprises a fan-out region 103 arranged on at least one side of the display region 101. In the present embodiment, a description is made by taking as an example that a plurality of fan-out regions 103 are provided at one side of the display region 101. An inverted triangle region 104 is formed between two adjacent fan-out regions 103 at the same side of the display region 101. The array substrate comprises a plurality of metal lines 200 and a plurality of floating metal lines 300, the metal lines 200 comprise a plurality of first metal lines 201 and a plurality of second metal lines 202, the first metal lines 201 are distributed in a fan shape in the fan-out region 103, and the second metal lines 202 are arranged in the inverted triangle region 104.

At least two of the first metal lines 201 are distributed in a divergent manner at one end close to the display region 101, and are distributed in a concentrated manner at one end far away from the display region 101. One end of the first metal line 201 is connected to a signal line (such as a data signal line) in the display region 101 of the array substrate, and the other end of the first metal line 201 is connected to a terminal pad on an edge of the array substrate. One of the first metal line 201 in the fan-out region 103 is electrically connected to a driving chip (such as a data driving chip). The signal lines comprise data signal lines and gate signal lines in the display region for conducting current and transmitting voltage. The first metal lines 201 in each fan-out region 103 are symmetrically arranged with respect to a center line of the fan-out region 103.

In the present embodiment, the floating metal lines 300 comprise a plurality of first floating metal lines 301 arranged in the inverted triangle region 104, and the first floating metal line 301 is located between the first metal line 201 and the second metal line 202.

In the present application, the second metal line 202 is a common electrode line (a COM line); however, the present application is not limited in this regard. A shape of the second metal line 202 may be one of a straight line, a curved line, and a polyline or a combination of more than one of a straight line, a curved line, and a polyline.

In the present application, the floating metal wire 300 is insulated from the metal wiring 200, and an orthographic projection of the metal lines 200 projected on the array substrate and an orthographic projection of the floating metal lines 300 projected on the array substrate are non-overlapping with each other.

Figure 2:
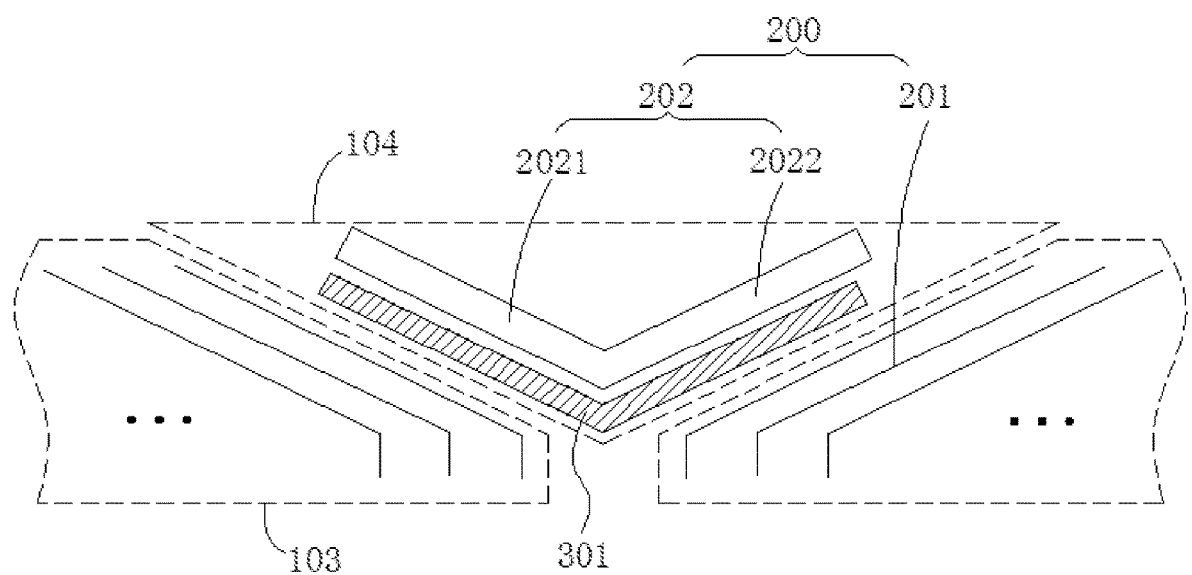
FIG. 2 is a partial structural view illustrating a first type of the array substrate according to a first embodiment of the present application.
Figure 3:
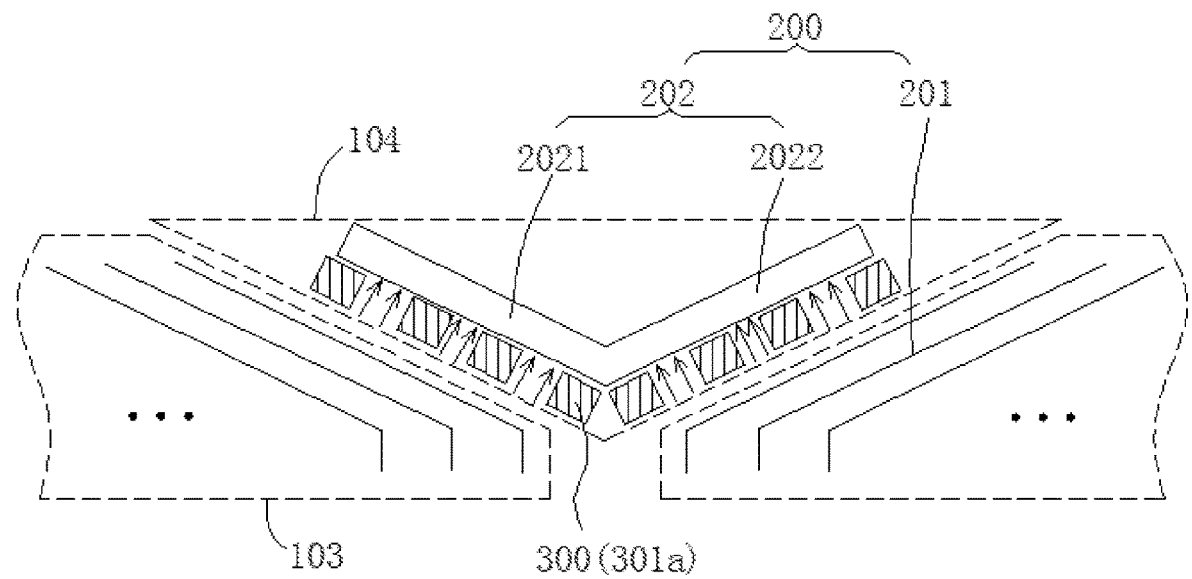
FIG. 3 is a partial structural view illustrating a second type of the array substrate according to the first embodiment of the present application.

As shown in FIG. 2 and FIG. 3, in the present embodiment, the second metal line 202 comprises a first portion 2021 and a second portion 2022 that are symmetrically arranged with respect to a center line between two adjacent fan-out regions 103 (i.e., a center line of the inverted triangle region), a wiring direction of the first portion 2021 is the same as a wiring direction of the adjacent first metal line 201 on a same side of the center line, and a wiring direction of the second portion 2022 is the same as a wiring direction of the adjacent first metal line 201 on a same side of the center line. With this design, since the second metal line 202 and the first metal line 201 have the same wiring direction, space can be saved, and a space utilization rate of the inverted triangle region 104 can be improved.

It should be noted that the floating metal lines 300 described in the present application has no actual electrical functions, but are only used to improve a terrain (uneven surface) of the fan-out region 103/the inverted triangle region 104.

As shown in FIG. 2, it is a partial structural view illustrating a first type of array substrate according to the first embodiment of this application. In the present embodiment, the first floating metal line 301 can be linear and arranged along the wiring direction of the first metal line 201 and/or the second metal line 202. Because the first floating metal line 301 fills a "recess" formed between the second metal line 202 in the inverted triangle region 104 and the first metal line 201 in the fan-out region 103, an alignment film material can be formed on a relatively flat substrate in subsequent processes, so that the alignment film material can smoothly spread onto the second metal line 202 in the inverted triangle region 104, which is beneficial to the spreading over of the alignment film material, thus preventing the alignment film material from accumulating in a "recess" area, thereby ensuring a uniform film thickness of an alignment film.

Referring to FIG. 3, it is a partial structural view illustrating a second type of array substrate according to the first embodiment of the present application. In this embodiment, the first floating metal line can include multiple floating metal blocks 301a, and the floating metal blocks 301a are arranged at intervals along the wiring direction of the first metal line 201 and/or the wiring direction of the second metal line 202. Since the floating metal blocks 301a fills up most of the "recess" between the second metal line 202 in the inverted triangle region 104 and the first metal line 201 in the fan-out region 103. Therefore, an amount of the alignment film material accumulated in the "recess" area is greatly reduced. In addition, due to a gap between two adjacent floating metal blocks 301a, the alignment film material on the side of the first metal line 201 can also be guided to the side of the second metal line 202, which is similar to a "drainage" function that is beneficial to the spreading over of the alignment film material, thereby ensuring the uniformity of film thickness of the alignment film.

Specifically, a direction of the gap between two adjacent floating metal blocks 301a is perpendicular to the wiring direction of the second metal line 202 and the wiring direction of the first metal line 201. That is to say, the direction of the gap is from the side of the fan-out region 103 toward the side of the inverted triangle region 104. Since a "groove" is formed in a position between two adjacent floating metal blocks 301a, the alignment film material can flow in a direction indicated by an arrow in the drawing due to a terrain (shape) of the groove. The groove formed between two adjacent floating metal blocks 301a has a flow guiding function, and can guide the alignment film material to flow along a direction from the fan-out region 103 toward the inverted triangle region 104. Under the guidance of the groove, the deposited alignment film material crosses the first metal lines 201 and the second metal lines 202 and flows smoothly into the inverted triangle region 104, thereby improving the uniformity of film thickness of the alignment film at edges and further solving an uneven brightness problem in the display region caused by uneven surface of the alignment film.

A distance between two adjacent floating metal blocks 301a ranges from one micrometer to ten micrometers. Therefore, the terrain (gap) between two adjacent floating metal blocks 301a can cause a phenomenon similar to "capillaries", which is beneficial to "drainage".

In the present application, a shape of the floating metal block 301a comprises, but is not limited to, a triangle, a circle, a rectangle, a parallelogram, or a rhombus.

In the present embodiment, the metal lines 200 and the floating metal lines 300 are arranged in the same layer, and a distance between the floating metal line 300 and the metal line 200 is greater than 8 micrometers (microns). This avoids short circuits between adjacent metal lines due to manufacturing processes or other reasons.

Figure 8:
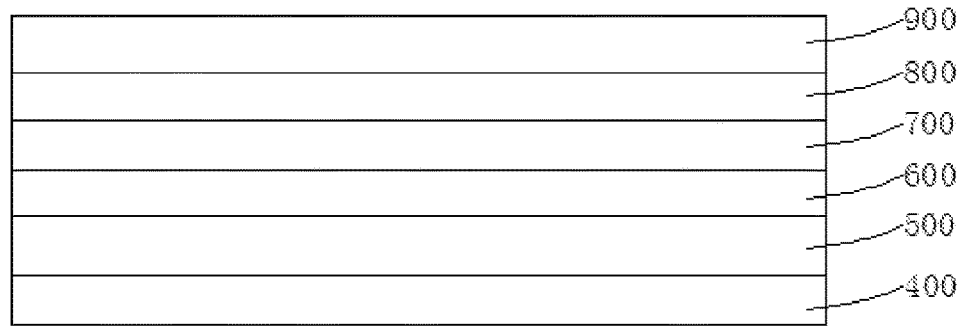
FIG. 8 is a schematic cross-sectional view illustrating the array substrate according to the present application.

Specifically, as shown in FIG. 8, the array substrate comprises a substrate 400, a first metal layer 500, a first insulating layer 600, a second metal layer 700, a second insulating layer 800, and an alignment film 900. The first metal layer 500 comprises, but is not limited to, a gate and a gate signal line. The second metal layer 700 comprises, but is not limited to, a source, a drain, and a data signal line. The metal line 200 and the floating metal line 300 can be made of the same material and in the same layer as the material and the layer of the first metal layer 500; or the metal line 200 and the floating metal line 300 can be made of the same material and in the same layer as the material and the layer of the first metal layer 500; or the metal line 200 and the floating metal line 300 can be made of the same material and in the same layer as the material and the layer of the second metal layer 700.

In another embodiment, the first metal line 201 and the second metal line 202 are arranged in different layers; the floating metal lines 300 comprise a plurality of first-layer metal lines arranged in the same layer as the first metal lines 201 and a plurality of second-layer floating metal lines arranged in the same layer as the second metal lines 202; and an orthographic projection of the first-layer floating metal lines projected on the array substrate and an orthographic projection of the second-layer floating metal lines projected on the array substrate are non-overlapping with each other.

Since the floating metal lines 300 can be made together with the first metal layer and/or the second metal layer by exposure and development, no additional photomask is needed, and because the floating metal line 300 is a floating metal structure, the floating metal line 300 does not have any influence on the electrical properties of a display panel.

Figure 9:
FIG. 9 is a schematic cross-sectional view illustrating a non-display region of the array substrate according to one embodiment of the present application.

Also referring to FIG. 9, because the first floating metal lines 301 fill the "recess" area formed between the second metal line 202 in the inverted triangle region 104 and the first metal line 201 in the fan-out region 103, the alignment film material can be formed on a relatively flat substrate in subsequent processes. Consequently, the alignment film material can smoothly spread onto the second metal line 202 in the inverted triangle region 104, which facilitates the spreading over of the alignment film material and prevents the alignment film material from accumulating in the "recess" area, thereby ensuring the uniformity film thickness of the alignment film.

Second Embodiment

Figure 4:
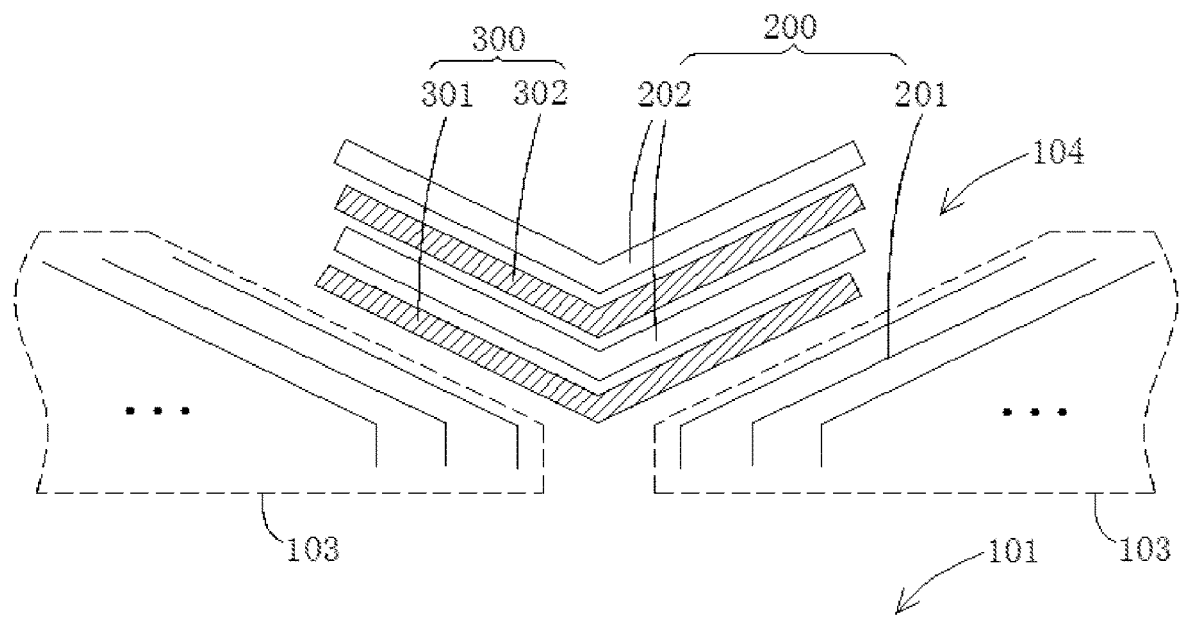
FIG. 4 is a partial structural view illustrating a first type of the array substrate according to a second embodiment of the present application.
Figure 5:
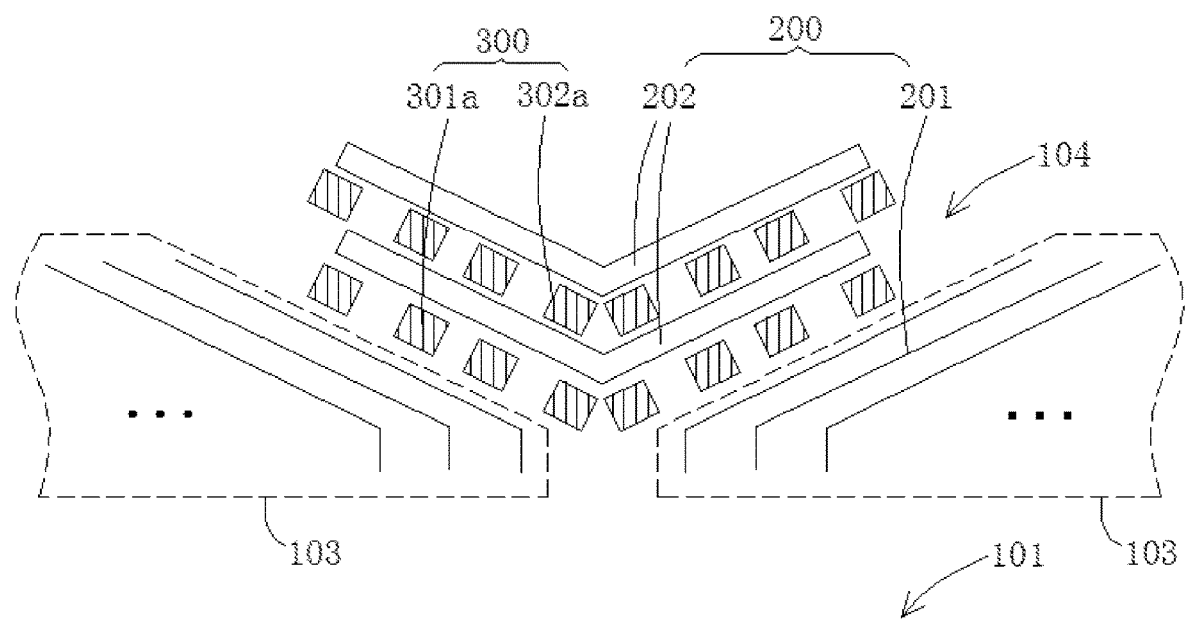
FIG. 5 is a partial structural view illustrating a second type of the array substrate according to the second embodiment of the present application.

As shown in FIG. 4 and FIG. 5, the structure of the array substrate in the present embodiment is the same as or similar to that in the first embodiment above. The difference is that: at least two of the second metal lines 202 are sequentially arranged at intervals in a direction, from near to far, with respect to the display region 101. The floating metal lines 300 also comprise a plurality of second floating metal lines 302 arranged in the inverted triangle region 104, and the second floating metal line 302 is located between two adjacent second metal lines 202.

In the present embodiment, the orthographic projection of the metal lines 200 projected on the array substrate and the orthographic projection of the floating metal lines 300 projected on the array substrate do not overlap.

In the present embodiment, the second floating metal line 302 and the first floating metal line 301 have the same structural design. As shown in FIG. 4, it is a partial structural view illustrating a first type of array substrate according to a second embodiment of the present application. The second floating metal line 302 can be linear and arranged along the wiring direction of the second metal line 202. Since the second floating metal line 302 fills a "recess" area formed between the two adjacent second metal lines 202 in the inverted triangle region 104, the alignment film material can subsequently be formed on a relatively flat substrate, further facilitating spreading the alignment film material can to the second metal line 202 on a boundary side of the array substrate, so as to prevent the alignment film material from accumulating in the "recess" area between the second metal lines 202 to ensure the uniformity of the film thickness of the alignment film.

Referring to FIG. 5, it is a partial structural view illustrating a second type of array substrate according to the second embodiment of the present application. In one embodiment, the second floating metal line can also comprise multiple floating metal blocks 302a, and the floating metal blocks 302a are arranged at intervals along the wiring direction of the second metal line 202. Since the floating metal blocks 302a fills most of the "recess" area formed between two adjacent second metal lines 202 in the inverted triangle region 104, the amount of accumulation of the alignment film material is greatly reduced in the "recess" area between two adjacent second metal lines 202. In addition, since a gap is formed between two adjacent floating metal blocks 302a, the gap can provide a function similar to "drainage", which is beneficial to the spreading over of the alignment film material, thereby ensuring the uniformity of the film thickness of the alignment film.

A distance between two adjacent floating metal blocks 302a ranges from 1 micrometer to 10 micrometers.

In the present application, a shape of the floating metal block 302a comprises, but is not limited to, a triangle, a circle, a rectangle, a parallelogram, and a rhombus.

Third Embodiment

Figure 6:
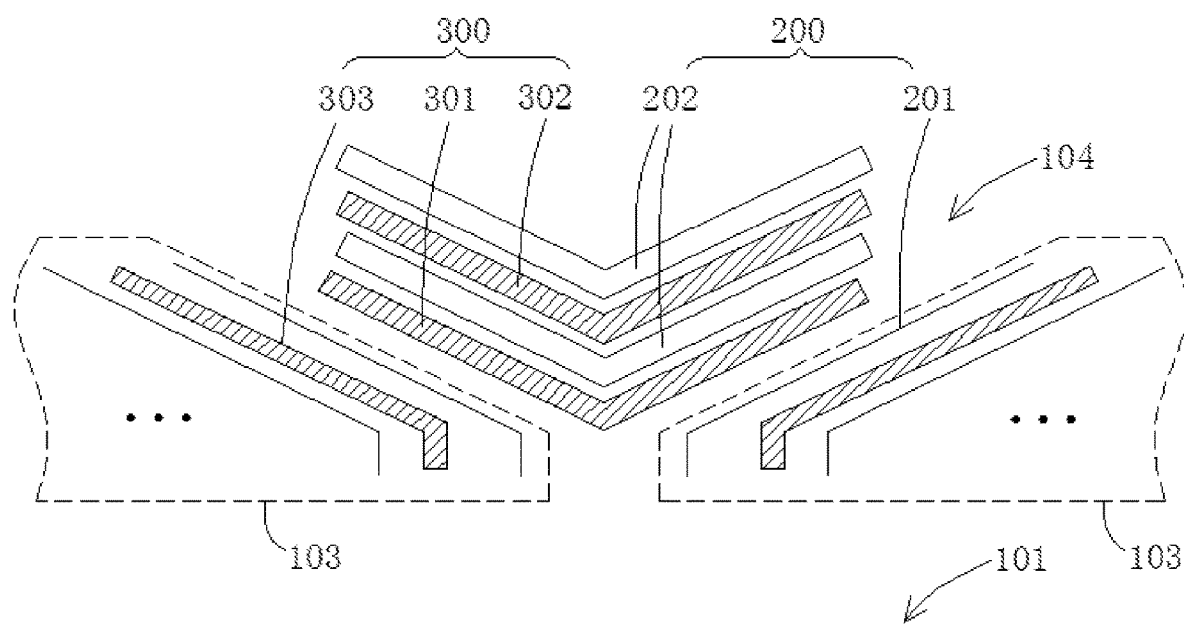
FIG. 6 is a partial structural view illustrating a first type of the array substrate according to a third embodiment of the present application.
Figure 7:
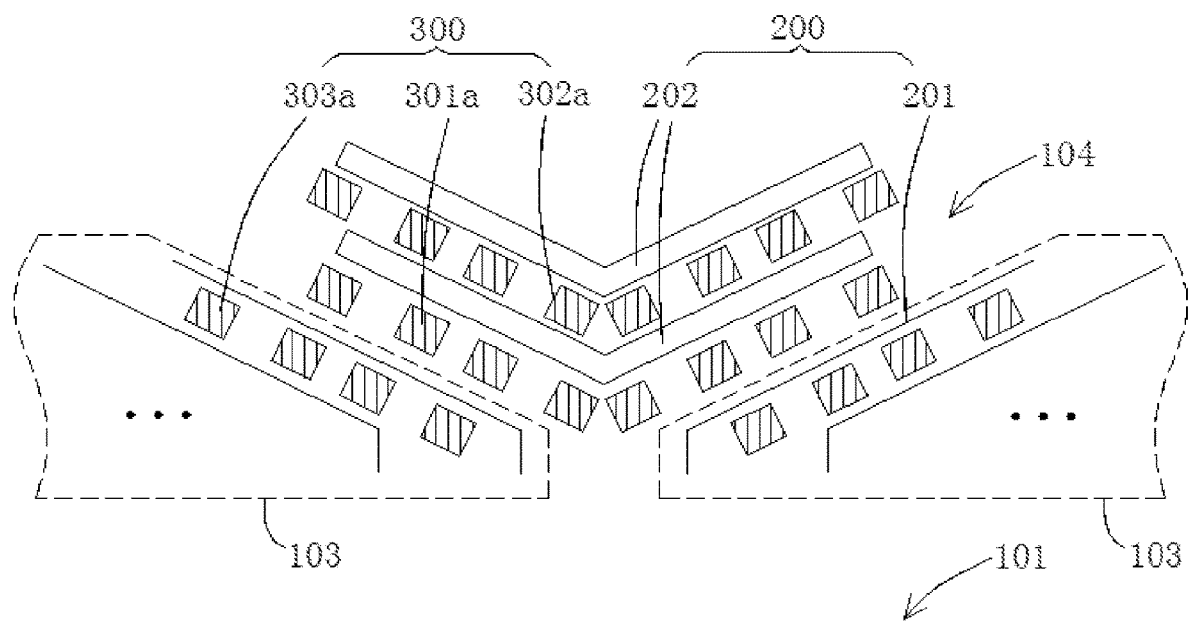
FIG. 7 is a partial structural view illustrating a second type of the array substrate according to the third embodiment of the present application.

As shown in FIG. 6 and FIG. 7, the structure of the array substrate in the present embodiment is the same as or similar to that in the foregoing second embodiment. The difference is that the floating metal line 300 further comprises a third floating metal line 303 arranged in the fan-out region 103. The third floating metal line 303 is located between two adjacent first metal wires 201.

In the present embodiment, the orthographic projection of the metal lines 200 projected on the array substrate and the orthographic projection of the floating metal lines 300 projected on the array substrate do not overlap.

In the present embodiment, the third floating metal line 303 can have the same structural design as the second floating metal line 302 and the first floating metal line 301.

Specifically, as shown in FIG. 6, it is a partial structural view illustrating a first type of array substrate according to the third embodiment of the present application. The third floating metal line 303 can be linear and arranged along the wiring direction of the first metal line 201. Since the third floating metal line 303 fills a "recess" area formed between two adjacent first metal lines 201 in the fan-out region 103, the alignment film material can be subsequently formed on a relatively flat substrate, and the alignment film material can be uniformly spread in the fan-out region 103, thus avoiding accumulation of the alignment film material in the "recess" area between two adjacent first metal lines 201 and ensuring the uniformity of the film thickness of the alignment film.

As shown in FIG. 7, it is a partial structural view illustrating a second type of array substrate according to the third embodiment of the present application. In one embodiment, the third floating metal line can also include multiple floating metal blocks 303a, and the floating metal blocks 303a are arranged at intervals along the wiring direction of the first metal line 201. Since the floating metal block 303a fills most of the "recess" area formed between two adjacent first metal lines 201, the amount of accumulation of the alignment film material is greatly reduced in the "recess" area between two adjacent first metal lines 201. In addition, since there is a gap between two adjacent floating metal blocks 303a, the gap can provide a function similar to "drainage", which is beneficial to the spreading of the alignment film material, thereby ensuring the uniformity of the film thickness of the alignment film.

A distance between two adjacent floating metal blocks 303a ranges from one micrometer to 10 micrometers.

In the present application, a shape of the floating metal block 303a comprises, but is not limited to, a triangle, a circle, a rectangle, a parallelogram, and a rhombus.

The present application also provides a display panel which comprises the above-mentioned array substrate, a color filter substrate and a liquid crystal layer.

The array substrate and the display panel provided by the present application can improve the terrain (uneven surface) of the inverted triangle region and/or the fan-out region by arranging floating metal lines at non-wiring portions of the inverted triangle region and/or the fan-out region, thereby reducing influences caused by the "retaining walls" formed by the first metal lines in the fan-out region and the second metal lines in the inverted triangle region, thus improving the uniformity of the film thickness of the alignment film, and solving the uneven brightness problem in the display region caused by uneven surface of the alignment film.

In summary, although the present application has been disclosed as above with reference to the preferable embodiments, the above-mentioned preferable embodiments are not intended to limit the application. Those of ordinary skill in the art can make various changes and modifications without departing from the spirit and scope of the present application. Such changes and modifications should be deemed to fall within the protection scope of the present application defined by the appended claims.

What is claimed is:

1. An array substrate, comprising a display region and a non-display region, wherein the non-display region is provided with at least two fan-out regions connected to a driving chip, and an inverted triangle region is formed between two adjacent fan-out regions at a same side of the display region;

the array substrate comprises a plurality of metal lines and a plurality of floating metal lines, the metal lines comprise a plurality of first metal lines and a plurality of second metal lines, the first metal lines are distributed in a fan shape in the fan-out region, and the second metal lines are arranged corresponding to the inverted triangle region;

the floating metal lines comprise a plurality of first floating metal lines arranged in the inverted triangle region, and the first floating metal line is located between the first metal lines and the second metal lines; and the array substrate further comprises an alignment film disposed on the metal lines and the floating metal lines.

2. The array substrate according to claim 1, wherein an orthographic projection of the metal lines projected on the array substrate and an orthographic projection of the floating metal lines projected on the array substrate are non-overlapping with each other.

3. The array substrate according to claim 1, wherein at least two of the first metal lines are distributed in a divergent manner at one end close to the display region, and are distributed in a concentrated manner at one end far away from the display region, and at least two of the second metal lines are arranged spaced apart from each other in a direction from near to away from the display region.

4. The array substrate according to claim 3, wherein the floating metal lines further comprise a plurality of second floating metal lines disposed in the inverted triangle region, and the second floating metal line is disposed between two adjacent second metal lines.

5. The array substrate according to claim 4, wherein the floating metal lines further comprise a plurality of third floating metal lines disposed in the fan-out region, and the third floating metal line is located between two adjacent first metal lines.

6. The array substrate according to claim 1, wherein the second metal line comprises a first portion and a second portion which are symmetrically arranged with respect to a center line between two adjacent fan-out regions, a wiring direction of the first portion is the same as a wiring direction of the adjacent first metal line on a same side of the center line, and a wiring direction of the second portion is the same as a wiring direction of the adjacent first metal line on a same side of the center line.

7. The array substrate according to claim 1, wherein the first metal lines and the second metal lines are arranged in different layers, the floating metal lines comprise a plurality of first-layer floating metal lines arranged in a same layer as the first metal lines and a plurality of second-layer floating metal lines arranged in a same layer as the second metal lines, and an orthographic projection of the first-layer floating metal lines projected on the array substrate and an orthographic projection of the second-layer floating metal lines projected on the array substrate are non-overlapping with each other.

8. The array substrate according to claim 1, wherein the metal lines and the floating metal lines are located in a same layer, and a distance between the floating metal line and the metal line is greater than 8 microns.

9. The array substrate according to claim 1, wherein the floating metal lines comprise multiple floating metal blocks, and the floating metal blocks are distributed at intervals along wiring directions of the first metal lines and/or wiring directions of the second metal lines.

10. The array substrate according to claim 9, wherein a direction of a gap formed between two adjacent floating metal blocks is perpendicular to the wiring direction of the second metal line and the wiring direction of the first metal line.

11. A display panel, comprising an array substrate, wherein the array substrate comprising a display region and a non-display region, wherein the non-display region is provided with at least two fan-out regions connected to a driving chip, and an inverted triangle region is formed between two adjacent fan-out regions at a same side of the display region;

the array substrate comprises a plurality of metal lines and a plurality of floating metal lines, the metal lines comprise a plurality of first metal lines and a plurality of second metal lines, the first metal lines are distributed in a fan shape in the fan-out region, and the second metal lines are arranged corresponding to the inverted triangle region;

the floating metal lines comprise a plurality of first floating metal lines arranged in the inverted triangle region, and the first floating metal line is located between the first metal lines and the second metal lines; and the array substrate further comprises an alignment film disposed on the metal lines and the floating metal lines.

12. The display panel according to claim 11, wherein an orthographic projection of the metal lines projected on the array substrate and an orthographic projection of the floating metal lines projected on the array substrate are non-overlapping with each other.

13. The display panel according to claim 11, wherein at least two of the first metal lines are distributed in a divergent manner at one end close to the display region, and are distributed in a concentrated manner at one end far away from the display region, and at least two of the second metal lines arranged spaced apart from each other in a direction from near to away from the display region.

14. The display panel according to claim 13, wherein the floating metal lines further comprise a plurality of second floating metal lines disposed in the inverted triangle region, and the second floating metal line is disposed between two adjacent second metal lines.

15. The display panel according to claim 14, wherein the floating metal lines further comprise a plurality of third floating metal lines disposed in the fan-out region, and the third floating metal line is located between two adjacent first metal lines.

16. The array substrate according to claim 11, wherein the second metal line comprises a first portion and a second portion that are symmetrically arranged with respect to a center line between two adjacent fan-out regions, a wiring direction of the first portion is the same as a wiring direction of the adjacent first metal line on a same side of the center line, and a wiring direction of the second portion is the same as a wiring direction of the adjacent first metal line on a same side of the center line.

17. The display panel according to claim 11, wherein the first metal lines are arranged in a layer different from a layer in which the second metal lines are arranged, the floating metal lines comprise a plurality of first-layer floating metal lines arranged in the same layer as the first metal lines and a plurality of second-layer floating metal lines arranged in the same layer as the second metal lines, and an orthographic projection of the first-layer floating metal lines projected on the array substrate and an orthographic projection of the second-layer floating metal lines projected on the array substrate are non-overlapping with each other.

18. The display panel according to claim 11, wherein the metal lines and the floating metal lines are located in a same layer, and a distance between the floating metal line and the metal line is greater than 8 microns.

19. The array substrate according to claim 11, wherein the floating metal lines comprise multiple floating metal blocks, and the floating metal blocks are distributed at intervals along wiring directions of the first metal lines and/or wiring directions of the second metal lines.

20. The array substrate according to claim 19, wherein a direction of a gap formed between two adjacent floating metal blocks is perpendicular to the wiring direction of the second metal line and the wiring direction of the first metal line.

* * * * *